United States Patent
Uetani et al.

(10) Patent No.: US 6,245,478 B1
(45) Date of Patent: *Jun. 12, 2001

(54) RESIST COMPOSITION

(75) Inventors: Yasunori Uetani, Toyonaka; Ichiki Takemoto, Kawanishi, both of (JP)

(73) Assignee: Sumitomo Chemical Company, Limited, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/398,998

(22) Filed: Sep. 17, 1999

(30) Foreign Application Priority Data

Sep. 18, 1998 (JP) .................................................. 10-264589

(51) Int. Cl.$^7$ ............................. G03F 7/023; G03F 7/008; G03F 7/004
(52) U.S. Cl. ........................ 430/191; 430/192; 430/196; 430/197; 430/270.1; 430/920
(58) Field of Search .................................. 430/192, 191, 430/196, 197, 270.1, 920

(56) References Cited

U.S. PATENT DOCUMENTS

| | | | |
|---|---|---|---|
| 5,846,688 | * 12/1998 | Fukui et al. | 430/270.1 |
| 5,891,603 | * 4/1999 | Kodama et al. | 430/270.1 |
| 5,962,180 | * 10/1999 | Iwanaga et al. | 430/170 |
| 5,985,511 | * 11/1999 | Yako et al. | 430/270.1 |
| 5,994,022 | * 11/1999 | Tanabe et al. | 430/170 |
| 6,030,746 | * 2/2000 | Nagata et al. | 430/270.1 |
| 6,068,962 | * 5/2000 | Uetani et al. | 430/191 |

* cited by examiner

*Primary Examiner*—John S. Chu
(74) *Attorney, Agent, or Firm*—Birch, Stewart, Kolasch & Birch, LLP

(57) ABSTRACT

A resist composition exhibiting an improved profile performance without impairing the resolution, the sensitivity, etc. which comprises a binder component; a radiation-sensitive component; and a succinimide compound represented by the following formula (I):

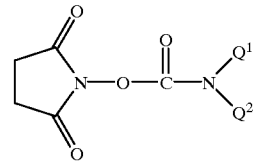

wherein $Q^1$ represents an alkyl group which may be optionally substituted with alkoxy, halogen or nitro, an alicyclic hydrocarbon residue, an aryl group, or an aralkyl group; and $Q^2$, which may be the same as or different from $Q^1$, represents hydrogen, an alkyl group which may be optionally substituted with alkoxy, halogen or nitro, an alicyclic hydrocarbon residue, an aryl group, or an aralkyl group.

10 Claims, No Drawings

RESIST COMPOSITION

The present invention relates to a resist composition, which is sensitive to radiations such as ultraviolet rays to give a positive or negative pattern and is suited for use in a fine working of semiconductors.

A resist causes a chemical change on irradiation with radiation and gives a positive or negative pattern by the following development. Known examples thereof include resist developed with an organic solvent and resist developed with an aqueous alkali solution. Examples of the resist developed with the aqueous alkali solution include novolak/quinonediazide type positive resists comprising an alkali-soluble novolak resin as a binder component and a quinonediazide compound as a radiation-sensitive component, novolak/azide type negative resists comprising the same alkali-soluble novolak resin as a binder component and an azide compound as a radiation-sensitive component, and chemical amplification type positive or negative resists comprising an alkali-soluble resin or a resin capable of being alkali-solubilized, as a binder component, and an active compound capable of generating an acid or base due to an action of radiation, as a radiation-sensitive component. The said chemical amplification type positive or negative resists utilize a catalytic action of the acid or base generated from the radiation-sensitive component.

With a recent trend of increased integration of integrated circuits, the formation of a submicron pattern has been required. As a result, resists having excellent resolution as well as excellent profile (shape of pattern) have been required. The finer the pattern becomes, the more a round top or a taper between the top and bottom of the pattern becomes conspicuous, thereby making it difficult to accurately reflect the shape of a mask on patterning exposure in the resulting pattern. Therefore, an improved resist composition capable of giving good profile has been required.

A simplest mean for improving the profile is that transparency of the resist is enhanced, for example, the amount of the radiation-sensitive component is decreased. However, the profile is not improved markedly only by decreasing the amount of the radiation-sensitive component to enhance the transparency. Further a decrease in amount of the radiation-sensitive component generally lowers the sensitivity.

An object of the present invention is to provide a resist composition capable of giving a profile having an excellent shape without impairing resist performances such as sensitivity and resolution.

The present inventors have intensively studied to attain such an object. As a result, they have found that a profile can be markedly improved by incorporating a certain compound into a resist composition containing a binder component and a radiation-sensitive component. Thus, the present invention was completed.

The present invention provides a resist composition comprising a binder component, a radiation-sensitive component, and a succinimide compound represented by the following formula (I):

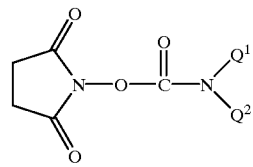

(I)

wherein $Q^1$ represents an alkyl group which may be optionally substituted with alkoxy, halogen or nitro, an alicyclic hydrocarbon residue, an aryl group, or an aralkyl group; and $Q^2$, which may be the same as or different from $Q^1$, represents hydrogen, an alkyl group which may be optionally substituted with alkoxy, halogen or nitro, an alicyclic hydrocarbon residue, an aryl group, or an aralkyl group.

The present applicant has already filed a Japanese patent application (JP-A-10-261757) for a invention of a chemical amplification type positive resist composition comprising a resin having a structural unit represented by the following formula:

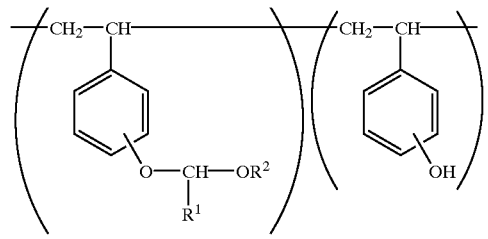

wherein $R^1$ and $R^2$ each independently represents an alkyl group or a cycloaklyl group, and total number of carbon atoms of the both is from 4 to 10, an acid generator, and a photo-base generator which has a substituted carbamoyloxy group represented by the following formula:

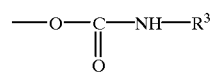

wherein $R^3$ represents a hydrocarbon residue, and is decomposed by an action of radiation to produce an amine. The present invention has been attained based on such a finding that a specific one among the aforementioned compounds having a substituted carbamoyloxy group as an effect of particularly improving a profile to various resist compositions.

In the resist composition of the present invention, a succinimide compound represented by the aforementioned formula (I) is incorporated, together with a binder component and a radiation-sensitive component. $Q^1$ and $Q^2$ in the formula (I) each independently represents an alkyl group, an alicyclic hydrocarbon residue, an aryl group, or an aralkyl group; with the proviso that $Q^2$ may also be hydrogen. Among them, the alkyl group may be substituted with alkoxy, halogen or nitro. The alkyl group may be an alkyl group having about 1 to 6 carbon atoms, such as methyl, ethyl, propyl, isoproyl, butyl, isobutyl, sec-butyl, tert-butyl, pentyl, hexyl or the like. The alkoxy, with which the alkyl group may be substituted, may be an alkoxy having about 1 to 4 carbon atoms. Halogen, with which the alkyl group may be substituted, may be chlorine, bromine or the like. Specific examples of the substituted alkyl group include 2-methoxyethyl and 2-chlorethyl. The alicyclic hydrocarbon residue, represented by $Q^1$ and $Q^2$ in the formula (I), may be monocyclic cycloaklyl or crosslinked polycyclic one, and usually has about 5 to 12 carbon atoms. Specific examples thereof include cyclopentyl, cyclohexyl, bornyl and admantyl. Examples of the aryl group include phenyl, tolyl, xylyl, methoxyphenyl and chlorophenyl. The aryl group usually has about 6 to 10 carbon atoms. Examples of the aralkyl group include benzyl, anisyl and phenyethyl. The aralkyl group usually has about 7 to 12 carbon atoms.

Among the succimimide compound represented by the formula (I), those wherein $Q^2$ is hydrogen, that is, N-(monosubstituted-carbamoyloxy)succinimide represented by the following formula (Ia):

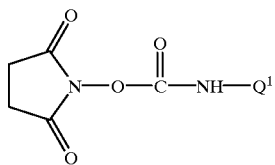

(Ia)

is preferred.

Some of the succinimide compounds represented by the formula (I) are described in K. Takeda et al., Tetrahydron Letters, Vol. 24, 4569–4572 (1983). Therefore, the succinimide compounds are publicly known. This compound can be produced, for example, by reacting N-hydroxysuccinimide with carbamoyl chloride having groups represented by $Q^1$ and $Q^2$ in the formula (I), or with isocyanate having a group represented by $Q^1$ in case where $Q^2$ in the formula (I) is hydrogen, in the presence of a base, if necessary. These reactions are represented by the following reaction formulas:

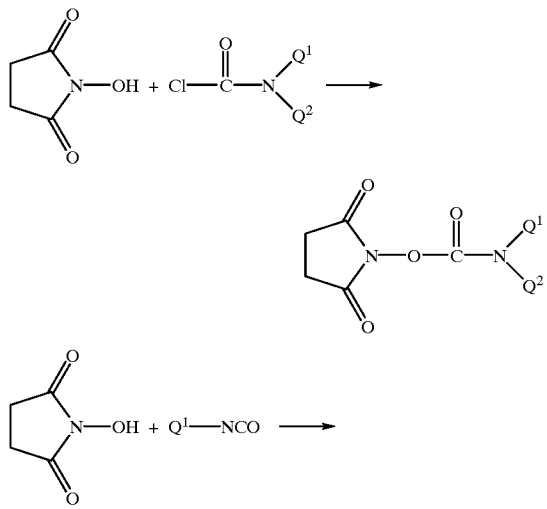

-continued

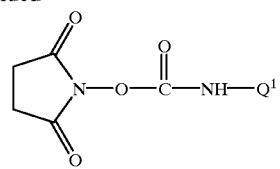

wherein $Q^1$ and $Q^2$ are as defined above.

Alternatively, the succinimide compound of the formula (I) can also be produced, for example, by reacting succinimidyl chlorocarbonate with a primary or secondary amine having groups represented by $Q^1$ and $Q^2$ in the formula (I) in the presence of a base as a dehydrochlorinating agent according to the following reaction formula:

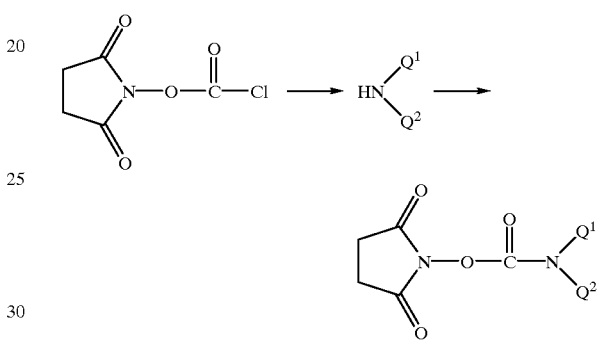

wherein $Q^1$ and $Q^2$ are as defined above. Succinimidyl chlorocarbonate used herein can be produced, for example, by the method described in T. Konakahara et al., SNYTHESIS, 103–106 (1993).

Examples of the succinimide compound represented by the formula (I) includes:

N-(methycarbamoyloxy)succinimide,

N-(ethylcarbamoyloxy)succinimide,

N-(hexylcarbamoyloxy)succinimide,

N-(cyclohexylcarbamoyloxy)succinimide,

N-(phenylcarbamoyloxy)succinimide,

N-(dimethylcarbamoyloxy)succinimde,

N-(diethylcarbamoyloxy)succinimide, and

N-(dicyclohexylcarbamoyloxy)succinimide.

By incorporating the succinimide compound represented by the formula (I) in the resist composition, the profile of a pattern obtained by irradiating a resist film formed from the composition with a radiation and developing can be improved. This reason is considered that this compound is hydrolyzed when coming into contact with a developer to generate a base (amine), thereby changing polarity of the compounds.

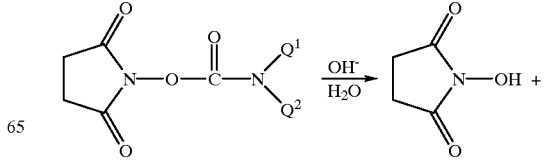

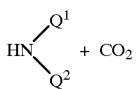

therefore, this succinimide compound is particularly effective for a resist composition developed with an aqueous alkali solution. As described hereinabove, the resist composition developed with the aqueous alkali solution includes, for example, a novolak/quinonediazide type positive resist comprising an alkali-soluble novolak resin as a binder component and a quinonediazide compound as a radiation-sensitive component, a novolak/azide type negative resist comprising an alkali-soluble novolak resin as a binder component and an azide compound as a radiation-sensitive component, and a chemical amplification type positive or negative resist comprising an alkali-soluble resin or a resin capable of being alkali-solubilized as a binder component and an active compound capable of generating an acid or base due to an action of radiation as a radiation-sensitive component, said chemical amplification type positive or negative resist utilizing a catalytic action of the acid or base generated from the radiation-sensitive component.

In then novolak/quinonediazide type positive resist and novolak/azide type positive resist of the present invention, a novolak resin generally used as the binder component in this kind of a resist composition can be used. The novolac resin is usually obtained by condensing phenolic compound with an aldehyde in the presence of an acid catalyst. Examples of the phenolic compound used in the production of the novolak resin include phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 2-tert-butyl-5-methylphenol, 2-, 4- or 5-methylresorcinol, 2-, 3- or 4-methoxyphenol, 2,3-, 2,5- or 3,5-dimethoxyphenol, 2-methoxyresorcinol, 4-tert-butylcatechol, 2-, 3- or 4-ethylphenol, 2,5- or 3,5-diethylphenol, 2,3,5-triethylphenol, 2-naphthol, 1,3-, 1,5- or 1,7-dihydroxynepthalene, and polyhydroxytriphenylmethane compound obtained by condensing xylenol with hydroxybenzaldehyde. These phenolic compounds can be used alone ,or in combination of two or more kinds of them.

Examples of the aldehyde used in the production of the novolak resin include aliphatic aldehydes such as formaldehyde, acetaldehyde, propionaldehyde, n-butylaldehyde, isobutylaldehyde, acrolein and crotonaldehyde; alicyclic aldehydes such as cyclohexanealdehyde, cyclopentanealdehyde, furfural and furylacrolein; aromatic aldehydes such as benzadldehyde, o-, m- or p-methylbenzaldehyde, p-ethylbenzaldehyde, 2,4-, 2,5-, 3,4- or 3,5-dimethylbenzaldehyde, and o-, m- or p-hydroxybenzaldehyde; and aromatic aliphatic aldehydes such as phenlacetaldehyde and cinnamaldehyde. These aldehydes can also be used alone or in combination of tow or more kinds of them. Among these aldehydes, formaldehyde is preferably used because it is industrially easily available.

Examples of the acid catalyst used for condensing the phenolic compound with the aldehyde include inorganic acid such as hydrochloric acid, sulfuric acid, perchloric acid and phosphoric acid; organic acid such as formic acid, acetic acid, oxalic acid, thrichloroacetic acid and p-toluenesulfonic acid; and divalent metal salt such as zinc acetate, zinc chloride and magnesium acetate. These acid catalysts can also be used alone, or in combination of two or more kinds of them. The condensation reaction can be conducted according to a conventional manner. For example, this reaction is conducted at a temperature within a range from about 60 to 120° C. for about 2 to 30 hours.

The novolak resin obtained by such a condensation reaction as explained above is preferably converted into a novolak resin containing exclusively a high molecular weight component by being subjected to an operation such as fractionation to remove a low molecular fraction, thereby narrowing the molecular weight distribution. Specifically, a ratio of the area of the molecular weight of not more than 1,000 is preferably 25% or less, and more preferably 20% or less, based on the total pattern area excluding unreacted monomer when the molecular weight of the novolak resin is measured by gel permeation chromatography (GPC) using a UV detector at 254 nm and using polystyrene as standard.

It is also effective to add an alkali-soluble phenolic compound having a molecular weight of not ore than 1,000 to the novolak resin wherein the amount of high molecular component has ben increased. Such an alkali-soluble phenolic compound preferably has at least two phenolic hydroxyl groups in its molecular structure. Examples thereof include those described in JP-A-2-275955 (=U.S. Pat. No. 5,456,995 + U.S. Pat. No. 5,456,996). A compound having a phenolic hydroxyl group, which can be used as a precursor of a quinonediazide radiation-sensitive component described hereinafter, can also be used a such an alkali-soluble phenolic compound referred herein. The alkali-soluble phenolic compound having a molecular weight of not more than 1,000 is preferably used in an amount within a range from 3 to 40% by weight based on the total amount of the novolak resin and the alkali-soluble phenolic compound.

In the novolak/quinonediazide type positive resist, such a novolak resin is used as the binder component and a quinonediazide compound is used as the radiation-sensitive component. A quinonediazide compound generally used as the radiation-sensitive component of the novolak/quinonediazide type positive resist may also be used a novolak/quinonediazide type positive resist of the present invention. The quinonediazide compound is usually o-quinonediazide sulfonate of a compound having a phenolic hydroxyl group. Preferably, the quinonediazide compound is 1,2-napththoquinonediazide-5- or 1,2-naphthoquinonediazide-4-sulfonate or 1,2-benzoquinonediazide-4-sulfonate of a polyhydroxy compound having at least three phenolic hydroxyl groups.

Examples of the compound having a phenolic hydroxyl group to be converted into o-quinonediazide sulfonate include polyhyroxybenzophenone compound, novolak polyhydroxy compound, polyhydroxyflavane compound, and polyhydroxytriphenylmethane compound. Specific examples thereof include:

polyhydroxybenzophenone compounds, such as
 2,3,4-trihydroxybenzophenone,
 2,3,3',4'-tetrahydroxybenzophenone,
 2,3,4,4'-tetrahydroxybenzophenone,
 2,2',4,4'-tetrahydroxybenzophenone,
 2,2',3,4-tetrahydroxybenzophenone,
 2,2',3,4'-tetrahydroxybenzophenone,
 2,2',5,5'-tetrahydroxybenzophenone,
 2,3',4',5-tetrahydroxybenzophenone,
 3,3',5,5'-tetrahydroxybenzophenone,
 2,2',4,4'-tetrahydroxy-3,3'-dimethylbenzophenone,
 2,2',3,4,4'-pentahydroxybenzophenone,
 2,2',3,4,5'-pentahydroxybenzophenone,
 2,2',3,3',4-pentahydroxybenzophenone,
 2,3,3',4,5'-pentahydroxybenzophenone,
 2,3,3',4,4',5'-hexahydroxybenzophenone and
 2,2',3,3',4,5'-hexahhdroxybenzophenone;
novolak polyhdroxy compounds, such as 4-(2,3,4-trihydroxybenzyl)phenol,
2,5- or 2,6-diemthyl-4-(2,3,4-trihydroxybenzyl)phenol,
2,3,5- or 2,3,6-trimethyl-4-(2,3,4-trihydroxybenzyl) phenol,
4- or 3-[1-(2,3,4-trihydroxyphenyl)-1-methylethyl] phenol,
4- or 3-[1-(2,4-dihydroxy-3-methylephenyl)-1-methylethyl]phenol,
4-[1-(2,3,4-trihydroxyphenyl)-1-methylethyl] pyrogallol,
2,6-bis(2-hydroxy-5-methylbenzyl)-4-methylphenol,
2,6-bis(4-hydroxy-3,5- or 2,5-dimethylbenzyl)-4-methylphenol,
2,6-bis(2-hydropxy-3,5-dimethylbenzyl)-4-methylphenol,
2,6-bis(2,4-dihydroxybenzyl)-4-methylphenol,
4,4'-methylenebis[2-(4-hydroxybenzyl)-3,6-dimethylphenol],
4,4'-methylenebis[2-(4-hydroxy-2,5- or 3,5-dimethylbenzyl)-3,6-dimethylphenol],
4,4'-methylenebis[2-(2-hydroxy-5-methylbenzyl)-3,6-dimethylphenol],
2,2'-methylenebis[6-(4-hydroxy-3-methylbenzyl)-4-methylphenol],
4,4'-methylenebis[2-(4-hydroxy-3- or 2-methylbenzyl)-3,6-dimethylphenol],
4,4'-methylenebis[2-(2,4-hydroxybenzyl)-3,6-dimethylphenol],
4,4'-methylenebis[2-(4-hydroxy-3- or 2-methylbenzyl) 6-methylphenol],
4,4'-methylenebis[2-(4-hydroxybenzyl)-6-methylphenol],
4,4'-methylenebis[2-(2-hydroxy-5-methylbenzyl)-6-methylphenol],
4,4'-methylenebis[2-(4-hydroxy-2,5- or 3,5-dimethylbenzyl)-6-methylpehnol],
1-[1,1-bis(4-hydroxyphenyl)ethyl]-4-[1-(4-hydroxyphenyl)-1-methylethyl]benzene,
2,4-bis[2-hydroxy-3-(4-hydroxy-2,3,6-trimethylbenzyl)-5-methylbenzyl ]-3,5,6-trimethylphenol,
2,6-bis[4-hydroxy-3-(4-hydroxy-3- or 2-methylbenzyl)-2,5-dimethylbenzyl ]-4-methylphenol,
2,6-bis[4-hydroxy-3-(4-hydroxy-2,6-dimethylbenzyl)-2,5-dimethylbenzyl]-4-methylphenol,
2,6-bis[4-hydroxy-3-(2-hydroxy-5-methylbenzyl)-2,5-dimethybenzyl]-4-methylphenol,
2,6-bis[4-hydroxy-3-(2-hydroxybenzyl)-2,5-dimethylbenzyl]-4-methylphenol,
2,6-bis[4-hydroxy-3-(2-hydroxy-4,5-dimethylbanzyl)-2,5-dimethylbanzyl]-4-methylphenol,
1,4-bis[1-{4-hydroxy-3-(4-hdyroxybenzyl)-5-methylphenyl}-1-methylethyl]benzene,
1,4-bis[1-{4-hydroxy-3-(2-hydroxy-5-methylbenzyl)phenyl}-1-methylethyl]benzene and
4,4'-methylenebis[2-{4-hydroxy-3-(2,4-dihydroxybenzyl)-5-methylbenzyl }-3,6-dimethylphenol];
polyhydroxyflavane compound, such as
2,4,4-trimethyl-2',4',7-trihydroxyflavane,
2,4,4-trimethyl-2',3',4',7,8-pentahydroxyflavane,
2,3',4,4,8-pentamethyl-2',4',7-trihydroxyflavane,
4-(1',2',3',4',4'a,9'a-hexahydro-6'-hydroxyspiro [cyclohexane-1,9'-xanthen]-4'a-yl)resorcinol,
4-(1,40 ,2',3',4',4'a,9'a-hexahydro-6'-hydroxy-5'-methylspiro [cyclohexane-1,9'-xanthen]-4'a-yl)-2-methylresorcinol and
4-(1',2',3',3'a,9',9'a-hexahydro-6'-hydroxyspiro [cyclopentane-1,9'-cyclopenta[b]chromen]-3'a-yl) resorcinol; and
polyhydroxytriphenylmethane compound, such as
4,4',4"-trihydroxytriphenylmethane,
3,4',4"-trihydroxytriphenylmethane,
3",4,4',4"-tetrahydroxy-3,3',5,5'-tetramethyltriphenylmethane,
2",3,4,4',4"-pentahydroxy-3,3',5,5'-tetramethyltriphenylmethane,
2",4,4'-trihydroxy-2,2',5,5'-tetramethyltriphenylmethane,
2",4,4'-trihydroxy-2,2',6,6'-tetramethyltriphenylmethane,
2,2',2"-trihydroxy-4,4',5,5'-tetramethyltriphenylmethane,
2",4,4'-, 3",4,4'- or 4,4',4"-trihydroxy-3,3',5,5'-tetramethyltriphenylmethane and
4,4',4"-trihydroxy-3-methoxytriphenylmethane.

By reacting such a compound having a phenolic hydroxyl group with halide o-quinonediazide sulfonate in the presence of a base such as triethylamine, o-quinonediazide sulfonate as the radiation-sensitive component can be produced. The quinonediazide radiation-sensitive components can be used alone, or in combination of two or more kinds of them.

In the novolak/azide type negative resist, aforementioned alkali-soluble novolak resin is used as the binder component and an aromatic azide compound is used as the radiation-sensitive component. Aromatic azide compounds generally used as the radiation-sensitive component in a novolak/azide type resist may also be used in the novolak/azide type resist of the present invention. Specific examples thereof include:

1-azidopyrene,
p-phenylenebisazide,
4,4'-diazidobiphenyl,
4,4'-diazido-3,3'-dimethylbiphenyl,
4,4'-diazidobiphenylmethane,
3,3'-dichloro-4,4'-diazidobiphenylmethane,
4,4'-diazidobiphenyl ether,
4,4'-diazidobiphenyl sulfide,
4,4'-diazidobiphenyl disulfide,
4,4'-diazidobiphenyl sulfone,
3,3'-diszidobiphhenyl sulfone,
4,4'-diazidobenzophenone,
4,4'-diazidobenzyl,
4,4'-diazidostilbene,
4,4'-diazidochalcone,
2,6-bis(4-azidobenzylidene)cyclohexanone,
2,6-bis(4-azidobenzylidene)-4-methylcyclohexanone and
2,7-diazidofluorene.

If necessary, the novolak/quinonediazide type positive resist and novolak/azide type negative resist can also contain a small amount of various additives used conventionally in this field, such as other resins, dyes and surfactants, in addition to aforementioned alkali-soluble novolak resins and radiation-sensitive components.

The chemical amplification type resist usually contains an alkali-soluble resin or a resin capable of being alkali-solubilized as a binder component and a compound capable of generating an acid due to an action of radiation as a radiation-sensitive component, and utilizes a catalytic action of the acid generated from the radiation-sensitive component. In the case of the chemical amplification type positive resist, an acid generated at the portion irradiated with radiation is diffused by the following heat treatment (post exposure bake) to cleave a protecting group of a resin, etc. and to reproduce an acid, thereby making the portion irradiated with radiation alkali-soluble. The chemical amplification type positive resist includes, for example, those containing the alkali-soluble binder resin as a binder component, a radiation-sensitive component and a dissolution inhibitor which has a protecting group capable of being cleaved by an action of an acid and itself has a dissolution inhibition capability to an alkali-soluble binder resin but being alkali-solubilized after the protecting group is cleaved by the action of the acid, and those wherein the binder resin has a protecting group capable of being cleaved by the action of the acid and the binder resin itself is insoluble or slightly soluble in an alkali but being alkali-solubilized after the protecting group is cleaved by the action of the acid. The chemical amplification type negative resist usually contains a crosslinking agent, in addition to an alkali-soluble binder resin as a binder component and a radiation-sensitive component. In such a chemical amplification type negative resist, an acid generated at the portion irradiated with radiation is diffused by the following heat treatment and reacted with the crosslinking agent, thereby curing the binder resin at the portion irradiated with radiation, and making the binder resin alkali-insoluble.

The binder resin which is per se alkali-soluble may be an alkali-soluble resin having a phenol skeleton, or an alkali-soluble resin which has a (meth)acrylic acid ester skeleton and an alicyclic ring and a carboxyl group at the alcohol side of the ester. Specific examples thereof include polyvinylphenol resin, polyisopropenylphenol resin, a resin wherein portion of hydroxyl groups of the polyvinylphenol resin or polyisopropenylphenol resin is alkyl-etherified, a copolymer resin of vinylphenol or isopropenylphenol and other polymerizable unsaturated compound, resin which is a polymer of alicyclic ester of (meth)acrylic acid and has a carboxyl group on the aliciclic ring, and a copolymer resin of alicyclic ester of (meth)acrylic acid and (meth)acrylic acid.

When using such a binder resin which is per se alkali-soluble, a dissolution inhibitor is used. The disolltion inhibitor may be a phenolic compound wherein the phenolic hydroxyl group is protected with a group which has a dissolution inhibition ability to an alkali developer but is cleaved by the action of an acid. Examples of the group capable of being cleaved by the action of the acid include tert-butoxycarbonyl group, which is substituted on the phenolic hydroxyl group. Examples of the dissolution inhibitor include 2,2-bis(4-tert-butoxycarbonyloxyphenyl)propane, bis(4-tert-butoxcarbonyloxyphenyl)sulfone and 3,5-bis(4-tert-butoxycarbonyloxyphenyl)-1,1,3-trimethylindane.

The binder resin which has a protecting group capable of being cleaved by an action of an acid and is itself insoluble or slightly soluble in an alkali but is alkali-solubilized after the protecting group is cleaved by the action of the acid may be those wherein a protecting group capable of being cleaved by the action of the acid is introduced into the aforementioned alkali-soluble resin such as resin having a phenol skeleton, resin having a (meth)acrylic acid skeleton or the like. Various known protective groups may be such a group which has a dissolution inhibition capability to an alkali developer but is unstable to the acid. Examples thereof include tert-butyl; groups wherein a quaternary carbon is linked to oxygen atom, such as tert-butoxycarbonyl and tert-butoxycarbonylmethyl; acetal type groups such as tetrahydro-2-pyranyl, tetrahydro-2-furyl, 1-ethyopxyethyl, 1-(2-methylpropoxy)ethyl, 1-(2-methoxyethoxy)ethyl, 1-(2-acetoxyethoxy)ethyl, 1-[2-(1-adamantyloxy)ethyoxy]ethyl and 1-[2-(1-adamantanecarbonyloxy)ethyoxy]ethyl; and residue of non-aromatic cyclic compound, such as 3-oxocyclohexyl, 4-methyltetrahydro-2-pyron-4-yl (derived from mevalonolactone) and 2-methyl-2-adamantyl. These groups are substituted with hydrogen of a phenolic hydroxyl group or hydrogen of a carboxyl group. These protecting groups can be introduced into a alkali-soluble resin having a phenolic hydroxyl group or a carboxyl group by a known protecting group introduction reaction. Aforementioned resins can also be obtained by copolymerization of an unsaturated compounds having such a group.

In the case of the chemical amplification type negative resist, alkali-soluble resin which is per se alkali-soluble is used as the binder resin. Various alkali-soluble resins listed previously as for the chemical amplification positive resist can also be used as the binder resin in the chemical amplification type negative resist. The chemical amplification type negative resist comprises a crosslinking agent, in addition to the binder component and radiation-sensitive component. Any crosslinking agents which can crosslink the binder resin by an action of an acid generated at the portion irradiated with radiation, thereby curing it, can be used. For example, a compound having a methylol group or alkyl ether compound thereof can be used as the crosslinking agent. Specific examples thereof include methylolmelamine and alkyl ether compound thereof, such as hexamethylolmelamine, pentamethylolmelamine, tetramethylolmelamine, hexamethoxymethylmelamine, pentamethoxymethylmelamine and tetramethoxymethylmelamine; methylolbenzoguanamine or alkyl ether compound thereof, such as tetramethylolbenzoguanamine, tetramethoxymethylbenzoguanamine and trimethoxymethylbenzoguanamine; 2,6-bis(hydroxymethyl) 4-methylphenol or alkyl ether compound thereof; 4-tert-butyl-2,6-bis(hydroxymethyl)phenol or alkyl ether compound thereof; 5-ethyl-1,3-bis(hydroxymethyl)perhydro-1, 3,5-triazin-2-one (common name: N-ethyldimethyloltriazine) or alkyl ether compound thereof; N,N- dimethyloltrimethyleneurea or dialkyl ether compound thereof; 3,5-bis(hydroxymethyl)perhydro-1,3,5-oxadiazin-4-one (common name: dimethylolurone) or alkyl ether compound thereof; and tetramethylolglyoxazaldiurein or dialkyl ether compound thereof.

The chemical amplification type resist containing an alkali-soluble resin or a resin capable of being alkali-solubilized as a binder component also contains an acid generator capable of generating an acid by an action of an acid. The acid generator includes various compounds capable of generating an acid by irradiating the substance itself or a resist composition containing the substance with radiation. Examples of the acid generator include onium salt, halogenated alkyltriazine compound, disulfone compound, compound having a diazomethanesulfonyl skeleton and sulfonate compound.

Specific examples thereof include:
onium salts, such as
diphenyliodonium trifluoromethanesulfonate,
4-methoxyphenylphenyliodonium hexafluoroantimonate,
4-methoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate, triphenylsulfonium hexafluorophosphate,
triphenylsulfonium hexafluoroantimonate,
triphenylsulfonium hexafluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate and
4-hydroxy-1-naphthyldimethylsulfonium trifluoromethanesulfonate;

halogenated alkyltriazine compound, such as
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine and
2-(4-pentyloxystyryl)-4,6-bis(trichloromethyl)-1,3,5-triazine;

disulfone compounds such as
diphenyl disulfone,
di-p-tolyl disulfone,
phenyl p-tolyl disulfone and
phenyl p-methoxyphenyl disulfone;

compound having a diazomethanesulfonyl skeleton, such as
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane and
(benzoyl)(phenylsulfonyl)diazomethane; and sulfonate compounds, such as
1-benzoyl-1-phenylmethyl p-toluenesulfonate (common name: benzointosylate),
2-benzoyl-2-hydroxy-2-phenylethyl p-toluenesulfonate (common name: α-methylolbenzointosylate),
α-(p-tolylsulfonyloxyimino)-4-methoxybenzylcyanide,
1,2,3-benzotoluyl trismethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(trifluoromethylsulfonyloxy)succinimide,
N-(butylsulfonyloxy)succinimide,
N-(10-camphorsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide and
N-(10-camphorsulfonyloxy)naphthalimide.

Other known examples of the chemical amplification type resist include those comprising a binder resin having a protecting group capable of being cleaved by an action of a base or a dissolution inhibitor having a protecting group capable of being cleaved by an action of a base and further comprising a base generator capable of generating a base by an action of radiation. The present invention can also be applied to such a chemical amplification type resist. Examples of the group capable of being cleaved by the action of the base include alkyl carbamate group and cycloalkyl carbamate group. That is, a resin or compound wherein a phenolic hydroxyl group is replaced by the alkyl carbamate group or cycloalkyl carbamate group can be used as the binder component or dissolution inhibitor. As the base generator, for example, 2-nitrobenzyl cyclohexaylcarbamate, 2,6-dinitrobenzyl cyclohexylcarbamate, formanilide and triphenylsulfonium hydroxide can be used, and these compounds are descomposed by an action of radiation to generate an amine or a hydroxyl anion.

The chemical amplification type resist can also contain a small amount of various additives known in this field. Example of the additives include quenchers such as amines, sensitizers, other resins, surfactants and dyes.

The present invention can be applied to aforementioned various resists containing a binder component and a radiation-sensitive component. Although the suitable ratio of the binder component to the radiation-sensitive component in the resist composition vary depending on the type of the resist, that is, combination of the binder component and radiation-sensitive component, it is generally selected such that the amount of the radiation-sensitive component is within a range from about 0.1 to 50 parts by weight based on 100 parts by weight of the alkali-soluble binder resin or a binder resin capable of being alkali-solubilized. In the case of the novolak/quinonediazide type positive resist, the quinoneazide compound as the radiation-sensitive component is preferably contained in an amount within a range from about 10 to 50 parts by weight based on 100 parts by weight of the total amount of the novolak resin as the alkali-soluble binder component and the optionally used alkali-soluble phenolic compound. In the case of the novolak/azide type positive resist, the azide compound as the radiation-sensitive component is preferably contained in an amount within a range from about 5 to 50 parts by weight based on 100 parts by weight of the novolak resin as the alkali-soluble binder component. In cases of chemical amplification type resist, either positive or negative resists, the acid generator or a base generator is preferably contained in the amount of about 0.1 to 30 parts by weight based on 100 parts by weight of the alkali-soluble binder resin or binder resin capable of being alkali-solublized. The amount of the succinimide compound represented by the formula (I) to be incorporated according to the present invention varies depending on the type of the resist, but is generally selected within a range from about 0.1 to 50% by weight based on total weight of the solid components in the resist composition. The amount of the succinimide compound represented by the formula (I) is preferably not less than 1% by weight, more preferably not less than 2% by weight, and not more than 30% by weight, more preferably not more than 25% by weight, based on total weight of the solid components in the resist composition.

EXAMPLES

The following Examples further illustrate the present invention in detail, but are not to be construed to limit the scope thereof. In the Examples, percentages and parts are by weight unless otherwise stated.

Synthesis Example 1

Synthesis of N-(cyclohexaylcarbamoyloxy) succinimide

N-hydroxysuccinimide (11.5 g, 0.1 mol) was dissolved in 200 g of sufficiently dried tetrahydrofuran. To the solution was added dropwise 12.5 g (0.1 mol) of cyclohexyl isocyanate, and then a catalytic amount of triethylamine was added. After stirring at room temperature overnight, the reaction solution was decolored with active carbon and concentrated. The deposited crystal was filtered and washed with a small amount of ether to obtain 18.0 g of N-(cyclohexylcarbamoyloxy)succinimide represented by the following formula. Yield: 81.5%.

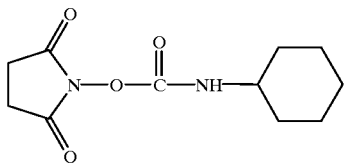

Melting point: 158–160° C.
$^1$H-NMR δ ppm (CDCl$_3$):
1.1–2.0 (10H, m), 2.82 (4H, s, CO—CH$_2$—CH$_2$—CO), 3.48 (1H, m, N—CH), 5.60 (1H, m, NH).

Synthesis Example 2

Synthesis of N-(ethylcarbamoyloxy)succinimide

N-hydroxysuccinimide (11.5 g, 0.1 mol) was dissolved in 100 g of sufficiently dried tetrahydrofuran. To the solution was added dropwise 7.1 g (0.1 mol) of ethyl isocyanate, and then a catalytic amount of triethylamine was added. After stirring at room temperature overnight, the reaction solution was decolored with active carbon and concentrated. The deposited crystal was filtered and washed with a small amount of ether to obtain 16.1 g of N-(ethylcarbamoyloxy) succinimide represented by the following formula, yield 86.6%.

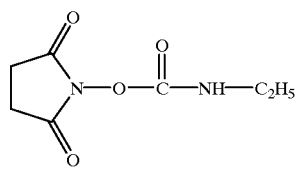

Melting point: 131–133° C.
$^1$H-NMR δ ppm (CDCl$_3$):
1.21 (3H, t, J=7.4 Hz, CH$_3$), 2.83 (4H, s, CO—CH$_2$—CH$_2$—CO), 3.31 (2H, m, N—CH$_2$), 5.66 (1H, m, NH).

Synthesis Example 3

Synthesis of N-(dicyclohexaylcarbamoyloxy) succinimide

According to the procedure described in H. Eckert et al., Angew. Chem. Int. Ed. Engl. 26, 894–895 (1987), dicyclohexylcarbamoyl chloride was synthesized from dicyclohexylamine and triphosgene [chemical name: bis (trichloromethyl)carbonate]. N-hydroxysuccinimide (5.3 g, 0.05 mol) was dissolved in 100 g of sufficiently dried pyridine. To the solution was added dropwise 13.7 g (0.05 mol) of cyclohexylcarbamoyl chloride. After stirring at room temperature overnight, the reaction solution was diluted with water and extracted with ethyl acetate. The organic layer was washed with water, dried over magnesium sulfate, decolored with active carbon and then concentrated. The deposited crystal was filtered and washed with a small amount of ether to obtain 4.6 g of N-(dicyclohexylcarbamoyloxy)succinimide represented by the following formula. Yield: 31.0%

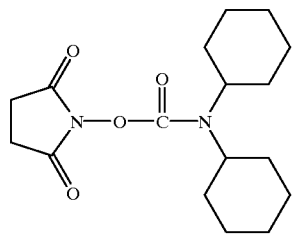

Melting point: 137–140° C.
$^1$H-NMR δ ppm (CDCl$_3$):
1.0–1.8 (20H, m), 2.81 (4H, s, CO—CH$_2$—CH$_3$—CO), 3.41 (2H, m, N—CH).

Synthesis Example 4

Partial ethoxyethyl etherification of poly(p-vinylphenol)

9.52 g of poly(p-vinylphenol) (trade name: "VP-15000") manufactured by Nippon Soda Co., Ltd., 0.011 g of p-toluenesulfonic acid and 114.3 g of propylene glycol monomethyl ether acetate were charged in a 500 ml reaction vessel, and dissolved at room temperature. Then, the resulting solution was concentrated until the total amount became 70.6 g. 2.86 g of ethyl vinyl ether was added thereto and, after stirring at room temperature for 3 hours, 53.4 g of methyl isobutyl ketone was added. Then, an operation of washing the solution with 41.0 g of deionized water was conducted three times. After the washing with water, the oil layer was concentrated to 38.2 g. To this oil layer, 39.5 g of propylene glycol monomethyl ether acetate was added and the mixture was concentrated again to 37.2 g to obtain a propylene glycol monomethyl ether acetate solution of a partially 1-ethoxyethyl-etherified poly(p-vinylphenol) resin. The solid content of this resin solution was 31.6%. A ratio of 1-ethoxyethyl-etherified hydroxyl groups among hydroxyl groups of the poly(p-vinylphenol) (1-ethoxyethyl etherification ratio) was measured by nuclear magnetic resonance according to a conventional method. As a result, it was 45.2%.

Synthesis Example 5

Partial ethyl etherification of poly(p-vinylphenol)

250 g of poly(p-vinylphenol) (trade name: "S2P") manufactured by Maruzen Petroleum Chemical Co., Ltd. and 1,000 g of acetone were charged in a 5 liter separable flask having a bottom discharge cock and equipped with a condenser and a stirrer, and then dissolved. 179.74 g of anhydrous potassium carbonate and 81.13 g of ethyl iodide were charged therein and, after heating until a reflux state was obtained, the reflux state was maintained for 12 hours. 1,250 g of 2-heptanone was added, and then the mixture was washed four times with an aqueous 2% oxalic acid and washed five times with deionized water. The mixture was partitioned every time of washing. The resulting oil layer was concentrated to obtain 860 g of a 2-heptanone solution of a partially ethyl-etherified poly(p-vinylphenol) resin. The solid content of this resin solution was 28.42%. A ratio of ethyl-etherified hydroxyl groups among hydroxyl groups of the poly(p-vinylphenol) (ethyl etherification ratio) was measured by nuclear magnetic resonance. As a result, is was 24.7%.

Synthesis Example 6

Synthesis of novolak resin 1,288.9 g of a m-/p-mixed cresol (content of m-cresol: 61.6%), 285.1 g of p-cresol, 207.4 g of an aqueous 12% oxalic acid, 476 g of an aqueous 90% acetic acid solution and 1,408 g of methyl isobutyl ketone were charged in a 5 liter reaction vessel equipped with a reflux condenser and a thermometer, and then heated to 80° C. 721.7 g of an aqueous 37% formaldehyde solution was added dropwise therein and, after heating to a reflux temperature, the reflux temperature was maintained for 12 hours. The resulting reaction solution was diluted with methyl isobutyl ketone, washed with water and dehydrated to obtain 3,375 g of a 32.6% methyl isobutyl ketone solution of novolak resin. 100 g of this resin solution was charged in a 5 liter bottom discharge flask and diluted with 133 g of methyl isobutyl ketone. Furthermore, 160 g of n-heptane was charged and stirred at 60° C., followed by standing and partitioning. The novolak resin solution of the lower layer was diluted with 2-heptanone and then concentrated to obtain 27.0 g of a 2-heptanone solution of novolak resin. The solid content of this resin solution was 34.4%.

Example 1

Chemical amplification type positive resist

10 Parts, calculated of the solid basis, of the propylene glycol monomethyl ether acetate solution of the partially 1-ethoxyethyl-etherified poly(p-vinylphenol) resin obtained in Synthesis Example 4, 0.4 parts of bis(cyclohexylsulfonyl) diazomethane as an acid generator, 0.015 parts of dicyclohexylamine as a quencher, 0.5 parts of N-(cyclohexylcarbamoyloxy)succinimide and propylene glycol monomethyl ether acetate were mixed and dissolved so that the total amount of propylene glycol monomethyl ether acetate becomes 60 parts. Then, the resulting solution was filtered through a fluororesin filter having a pore diameter of 0.2 $\mu$m to prepare a resist solution. Then, the resist solution was coated on a silicon wafer coated with an organic anti-reflective film using a spin coater so that a dry film having the thickness of 0.52 $\mu$m is formed. The organic anti-reflective film was formed by coating "DUV-42" manufactured by Brewer Co. so that the thickness became 600 Å under the baking conditions of a temperature of 215° C. for 60 seconds. Prebaking after coating the resist solution was conducted on a direct hot plate at a temperature of 90° C. for 60 seconds.

Using a KrF excimer laser stepper ["NSR2205 EX-12B" manufactured by Nikon Co., Ltd., NA=0.55], a line-and-space pattern was formed on the wafer provided with the resist film by light exposure. On a hot plate, post exposure baking was conducted at a temperature of 100° C. for 60 seconds and, then, puddle development was conducted using an aqueous 2.38% tetramethylammonium hydroxide solution for 60 seconds. The pattern after development was observed by using a scanning electron microscope and the effective sensitivity, resolution and profile were examined according to the following manner. The results are shown in Table 1.

Effective sensitivity: It was represented by the dose where the 0.25 $\mu$m line-and-space pattern becomes 1:1.

Resolution: It was represented by the minimum size of the line-and-space pattern which is separated by the dose of the effective sensitivity.

Profile: It was represented by a ratio of the width T of the top flat portion of the pattern to the width B of the bottom portion (portion bonded with a substrate), that is, T/B, by observing the cross section of a 0.25 $\mu$m line-and-space pattern at the effective sensitivity. The closer this value T/B gets to 1, the better the rectangularity becomes, resulting in good pattern profile.

Comparative Example 1

A resist solution was prepared according to the same formulation as in Example 1, except that N-(cyclohexylcarbamoyloxy)succinimide was not added, and the evaluation was conducted in the same manner. The results are shown in Table 1.

TABLE 1

| | Effective sensitivity | Resolution | Profile (T/B) |
|---|---|---|---|
| Example 1 | 60 mJ/cm$^2$ | 0.18 $\mu$m | 0.8 |
| Comparative Example 1 | 42 mJ/cm$^2$ | 0.18 $\mu$m | 0.5 |

Example 2

Chemical amplification type negative resist

10 Parts, calculated on the solid basis, of the 2-heptanone solution of the partially ethyl-etherified poly(p-vinylphenol) resin btained in Synthesis Example 5, 0.2 parts of α-(p-tolylsulfonyloxyimino)-4-methoxybenzylcyanide as an acid generator, 0.75 parts of hexamethoxymethylmelamine ["M-100C" manufactured by Sumitomo Chemical Industries Co., Ltd.] as a crosslinking agent, 0.5 parts of N-(cyclohexylcarbamoyloxy)succinimide and 2-heptanone were mixed and dissolved so that the total amount of 2-heptanone becomes 45 parts. Then, the resulting solution was filtered through a fluororesin filter having a pore diameter of 0.2 $\mu$m to prepare a resist solution. Thereafter, the resist solution was coated on a silicon wafer treated with hexamethyldisilazane using a spin coater so that the film thickness after dried became 0.53 $\mu$m. A dry resist film was formed on a direct hot plate by prebaking at a temperature of 100° C. for 60 seconds.

Using a i-lines stepper ["NSR2005 i9C" manufactured by Nikon Co., Ltd., NA=0.57, σ=0.6, light intensity: 500 mW/cm$^2$], a line-and-space pattern was formed on the wafer provided with the resist film by light exposure. On a hot plate, post exposure baking was conducted at a temperature of 110° C. for 60 seconds and, then, puddle development was conducted using an aqueous 2.38% tetramethylammonium hydroxide solution for 60 seconds. The pattern after development was observed by using a scanning electron microscope and the effective sensitivity, resolution and profile were examined in the following manner. The results are shown in Table 2.

Effective sensitivity: It was represented by the dose where the 0.50 $\mu$m line-and-space pattern becomes 1:1.

Resolution: It was represented by the minimum size of the line-and-space pattern which is separated by the dose of the effective sensitivity.

Profile: It was represented by a ratio of the width T of the top flat portion of the pattern to the width B of the bottom portion (portion bonded with a substrate), that is, T/B, by observing the cross section of a 0.50 $\mu$m line-and-space pattern at the effective sensitivity. The closer this value T/B gets to 1, the better the rectangularity becomes, resulting in good pattern profile.

Comparative Example 2

A resist solution was prepared according to the same formulation as in Example 2, except that N-(cyclohexylcarbamoyloxy)succinimide was not added, and the evaluation was conducted in the same manner. The results are shown in Table 2.

TABLE 2

|  | Effective sensitivity | Resolution | Profile (T/B) |
| --- | --- | --- | --- |
| Example 2 | 70 msec | 0.32 $\mu$m | 0.73 |
| Comparative Example 2 | 50 msec | 0.34 $\mu$m | 0.56 |

Example 3

Quinoneazide type positive resist

10 Parts, calculated on the solid basis, of the 2-heptanone solution of the novolak resin obtained in Synthesis Example 6, 3.5 parts of a condensate of 2,4,4-trimethyl-2',4',7-trihydroxyflavane and 1,2-naphthoquinonediazide-5-sulfonic acid chloride in a reaction molar ratio of 1:2.6 as a radiation-sensitive component, 3.5 parts of 4,4'-(2-hydroxybenzylidene)di-2,6-xylenol [another name: 2'',4,4'-trihydroxy-2,2',6,6'-tetramethyltriphenylmethane] as an additive (alkali-soluble lower molecular weight phenolic compound), 0.5 parts of N-(cyclohexylcarbamoyloxy)succinimide and 2-heptanone were mixed and dissolved so that the total amount of 2-heptanone becomes 60 parts. Then, the resulting solution was filtered through a fluororesin filter having a pore diameter of 0.2 $\mu$m to prepare a resist solution. Thereafter, the resist solution was coated on a silicon wafer treated with hexamethyldisilazane using a spin coater so that the film thickness after dried becomes 1.06 $\mu$m. A dry resist film was formed on a direct hot plate by prebaking at a temperature of 90° C. for 60 seconds.

Using the same i-lines stepper as in Example 2, a line-and-space pattern was formed on the wafer provided with the resist film by light exposure. On a hot plate, post exposure baking was conducted at a temperature of 110° C. for 60 seconds and, then, puddle development was conducted using an aqueous 2.38% tetramethylammonium hydroxide solution for 60 seconds. The pattern after development was observed by using a scanning electron microscope and the effective sensitivity, resolution and profile were examined in the following manner. The results are shown in Table 3.

Effective sensitivity: It was represented by the dose where the 0.40 $\mu$m line-and-space pattern becomes 1:1.

Resolution: It was represented by the minimum size of the line-and-space pattern which is separated by the dose of the effective sensitivity.

Profile: It was represented by a ratio of the width T of the top flat portion of the pattern to the width B of the bottom portion (portion bonded with a substrate), that is, T/B, by observing the cross section of a 0.40 $\mu$m line-and-space pattern at the effective sensitivity. The closer this value T/B gets to 1, the better the rectangularity becomes, resulting in good pattern profile.

Comparative Example 3

A resist solution was prepared according to the same formulation as in Example 3, except that N-(cyclohexylcarbamoyloxy)succinimide was not added and the amount of 4,4'-(2-hydroxybenzylidene)di-2,6-xylenol was changed to 4 parts by weight, and the evaluation was conducted in the same manner. The results are shown in Table 3.

TABLE 3

|  | Effective sensitivity | Resolution | Profile (T/B) |
| --- | --- | --- | --- |
| Example 3 | 270 msec | 0.32 $\mu$m | 0.9 |
| Comparative Example 3 | 240 msec | 0.34 $\mu$m | 0.8 |

As described above, the profile performance is improved by the addition of N-(ccylohexylcarbamoyloxy)succinimide in all of the chemical amplification type positive resist, chemical amplification type negative photoresist and quinonediazide type positive resist. The resolution is good and the sensitivity is not drastically impaired.

According to the present invention, the profile of the resist pattern can be improved by containing a specific succinimide compound.

What is claimed is:

1. A resist composition comprising a binder component; a radiation-sensitive component; and a succinimide compound represented by the following formula (I):

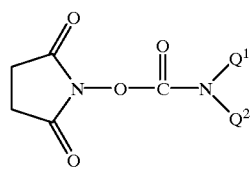
(I)

wherein $Q^1$ represents an alkyl group which may be optionally substituted with alkoxy, halogen or nitro, an alicyclic hydrocarbon residue, an aryl group, or an aralkyl group; and $Q^2$, which may be the same as or different from $Q^1$, represents hydrogen, an alkyl group which may be optionally substituted with alkoxy, halogen or nitro, an alicyclic hydrocarbon residue, an aryl group, or an aralkyl group.

2. A resist composition according to claim 1, wherein the succimimide compound is N-(monosubstituted-carbamoyloxy)succinimide represented by the following formula (Ia).

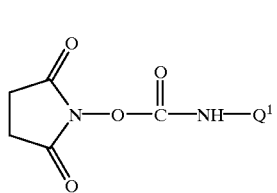
(Ia)

3. A resist composition according to claim 1, wherein the succimimide compound is N-(methylcarbamoyloxy)succinimide, N-(ethylcarbamoyloxy)succinimide, N-(hexylcarbamoyloxy)succinimide, N-(cyclohexylcarbamoyloxy)succinimide, N-(phenylcarbamoyloxy)succinimide, N-(dimethylcarbamoyloxy)succinimide, N-(diethylcarbamoyloxy)succinimide or N-(dicyclohexylcarbamoyloxy)succinimide.

4. A resist composition according to claim 1, wherein the succimimide compound is N-(ethylcarbamoyloxy)succinimide, N-(cyclohexylcarbamoyloxy)succinimide, or N-(dicyclohexylcarbamoyloxy)succinimide.

5. A resist composition according to claim 1, wherein the succimimide compound is N-(cyclohexylcarbamoyloxy)succinimide.

6. A resist composition according to claim 1, which is developed with an aqueous alkali solution.

7. A resist composition according to claim 1, which is a positive resist wherein the binder component is an alkali-soluble novolak resin and the radiation-sensitive component is a quinonediazide compound.

8. A resist composition according to claim 1, which is a negative resist wherein the binder component is an alkali-soluble novolak resin and the radiation-sensitive component is an azide compound.

9. A resist composition according to claim 1, which is, a chemical amplification type positive resist wherein the binder component is an alkali-soluble resin or a resin capable of being alkali-solubilized, and the radiation-sensitive component is an active compound capable of generating an acid or base due to an action of radiation.

10. A resist composition according to claim 1, which is, a chemical amplification type negative resist comprising an alkali-soluble resin or a resin capable of being alkali-solubilized as a binder component, an active compound capable of generating an acid or base due to an action of radiation as a radiation-sensitive component, and a crosslinking agent.

* * * * *